US011809668B2

(12) United States Patent
Lim et al.

(10) Patent No.: US 11,809,668 B2
(45) Date of Patent: Nov. 7, 2023

(54) ELECTRONIC DEVICE HAVING A SENSING ELECTRODE INCLUDING A TRUNK PORTION AND A BRANCH PORTION

(71) Applicant: Samsung Display Co., Ltd., Yongin-Si (KR)

(72) Inventors: Sanghyun Lim, Cheonan-si (KR); Gayoung Kim, Hwaseong-si (KR); Youngmin Park, Gwangmyeong-si (KR); Hyunjee Jeon, Hanam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/582,890

(22) Filed: Jan. 24, 2022

(65) Prior Publication Data

US 2022/0326809 A1 Oct. 13, 2022

(30) Foreign Application Priority Data

Apr. 8, 2021 (KR) .................. 10-2021-0045980

(51) Int. Cl.
*G06F 3/044* (2006.01)
*H04M 1/02* (2006.01)
*H10K 59/40* (2023.01)

(52) U.S. Cl.
CPC ........ *G06F 3/0446* (2019.05); *H04M 1/0266* (2013.01); *H10K 59/40* (2023.02); *H04M 2250/22* (2013.01)

(58) Field of Classification Search
None
See application file for complete search history.

(56) References Cited

U.S. PATENT DOCUMENTS

| 7,864,160 B2 | 1/2011 | Geaghan et al. | |
| 9,513,755 B2 | 12/2016 | Chai et al. | |
| 9,791,982 B2 | 10/2017 | Park et al. | |
| 10,372,263 B2 | 8/2019 | Nakamura | |
| 2010/0302201 A1* | 12/2010 | Ritter ................... | G06F 3/0446 345/174 |
| 2011/0007020 A1* | 1/2011 | Hong ................... | G06F 3/0446 345/174 |
| 2013/0088459 A1* | 4/2013 | Yeh ....................... | G06F 3/0448 345/174 |

(Continued)

FOREIGN PATENT DOCUMENTS

| CN | 114461088 A | * | 5/2022 | |
| GB | 2559572 A | * | 8/2018 | ........... G06F 3/0412 |

(Continued)

*Primary Examiner* — Kirk W Hermann
(74) *Attorney, Agent, or Firm* — Innovation Counsel LLP

(57) ABSTRACT

An electronic device includes a display panel and an input sensor disposed on the display panel and having a first sensing electrode extending in a first direction. The first sensing electrode includes a first trunk portion extending in the first direction and a first branch portion extending from the first trunk portion in a second direction crossing the first direction. The first branch portion includes a plurality of first branches and a plurality of second branches. The first branches extend in a direction opposite to a direction in which the second branches extend in the second direction, and the number of the first branches is equal to the number of the second branches.

18 Claims, 10 Drawing Sheets

(56) References Cited

U.S. PATENT DOCUMENTS

| | | | | |
|---|---|---|---|---|
| 2015/0042598 A1* | 2/2015 | Chae | ........................ | G06F 3/041 |
| | | | | 345/174 |
| 2015/0261251 A1* | 9/2015 | Shepelev | .............. | G06F 3/0418 |
| | | | | 345/174 |
| 2017/0228063 A1* | 8/2017 | Wang | .................... | G06F 3/0443 |
| 2021/0216170 A1* | 7/2021 | Wang | .................... | G06F 3/0412 |

FOREIGN PATENT DOCUMENTS

| | | | | |
|---|---|---|---|---|
| JP | 2010198586 A | * | 9/2010 |
| KR | 101500295 B1 | * | 3/2015 |
| KR | 10-2149498 B1 | | 9/2020 |

* cited by examiner

ELECTRONIC DEVICE HAVING A SENSING ELECTRODE INCLUDING A TRUNK PORTION AND A BRANCH PORTION

CROSS-REFERENCE TO RELATED APPLICATION

This U.S. non-provisional patent application claims priority under 35 U.S.C. § 119 of Korean Patent Application No. 10-2021-0045980, filed on Apr. 8, 2021, the contents of which are hereby incorporated by reference in its entirety.

BACKGROUND

1. Field of Disclosure

The present disclosure generally relates to an electronic device. More particularly, the present disclosure relates to an electronic device having improved sensing reliability.

2. Description of the Related Art

An electronic device senses an external input applied thereto from the outside of the electronic device. The external input is a user input. The user input includes various forms of external inputs, such as a part of a user's body, light, heat, or pressure. The electronic device obtains coordinates of a pen using an electromagnetic resonance (EMR) scheme or an active electrostatic (AES) scheme.

SUMMARY

The present disclosure provides an electronic device having improved sensing reliability.

The present disclosure provides an electronic device including an input sensor with improved coordinate accuracy.

The present disclosure provides an electronic device capable of enhancing a signal sensitivity of an adjacent electrode and improving coordinate accuracy of an input sensor through a sensing electrode including a trunk portion and a branch portion.

Embodiments of the present disclosure provide an electronic device including a display panel and an input sensor disposed on the display panel and having a first sensing electrode extending in a first direction. The first sensing electrode includes a first trunk portion extending in the first direction and a first branch portion extending from the first trunk portion in a second direction crossing the first direction. The first branch portion includes a plurality of first branches and a plurality of second branches, the first branches extend in a direction opposite to a direction in which the second branches extend in the second direction, and a number of the first branches is equal to a number of the second branches.

The input sensor includes an active area in which the first sensing electrode is disposed and a peripheral area in which signal lines connected to the first sensing electrode are disposed, and the peripheral area is defined adjacent to the active area.

The first branch portion is disposed in the active area.

The first sensing electrode is provided in plural, and the first sensing electrodes are arranged in the second direction.

The first branches and the second branches are substantially perpendicular to the first trunk portion.

The input sensor further includes a second sensing electrode substantially perpendicular to the first sensing electrode and extending in the second direction. The second sensing electrode includes a second trunk portion extending in the second direction and a second branch portion extending from the second trunk portion in the first direction, the second branch portion includes a plurality of third branches and a plurality of fourth branches, the third branches extend in a direction opposite to a direction in which the fourth branches extend, and a number of the third branches is equal to a number of the fourth branches.

The first trunk portion includes a plurality of first sensing portions and a plurality of first connection portions disposed between the first sensing portions and connecting the adjacent first sensing portions, the first sensing portions are disposed on a layer different from a layer on which the first connection portions are disposed, the second trunk portion includes a plurality of second sensing portions and a plurality of second connection portions disposed between the second sensing portions and connecting the adjacent second sensing portions, and the second sensing portions are disposed on a same layer as the second connection portions.

The first branch portion extends from the first sensing portion in the second direction, and the second branch portion extends from the second sensing portion in the second direction.

The electronic device further includes a sensor controller. The input sensor further includes a first signal line connected to the first sensing electrode and a second signal line connected to the second sensing electrode, and the first signal line and the second signal line are connected to the sensor controller.

The active area of the input sensor includes a plurality of unit areas each having a first pitch, and at least one of the first branches and at least one of the second branches are disposed in each of the unit areas.

A straight distance from one end of the first branch to one end of the second branch in the second direction is larger than the first pitch.

Each of the first trunk portion and the first branch portion is provided in plural.

A length of the first branches is different from a length of the second branches.

First branches different from each other and respectively included in the first branch portions different from each other and adjacent to each other among the first branch portions face each other, and second branches different from each other and respectively included in the first branch portions different from each other and adjacent to each other among the first branch portions extend in opposite directions to each other.

The first branch portions are electrically connected to each other.

The first branches and the second branches include a first portion that is adjacent to the first trunk portion and a second portion that is not adjacent to the first trunk portion, and the second portion has a width greater than a width of the first portion.

The input sensor includes an active area in which the first sensing electrode is disposed and a peripheral area defined adjacent to the active area, and the active area includes a first unit area and a second unit area adjacent to the first unit area.

The first trunk portion and at least some portions of the first portion are disposed in the first unit area, and an entirety of the second portion is disposed in the second unit area.

The second portion of the first branches has a shape different from a shape of the second portion of the second branches.

Embodiments of the present disclosure provide an electronic device including a display panel and an input sensor disposed on the display panel, including an active area defined therein and including a plurality of unit areas, and including a plurality of unit sensing electrodes respectively disposed in the unit areas. A length in the first direction of each of the unit areas is smaller than a minimum length of a straight line of each of the unit sensing electrodes in the first direction.

Each of the unit sensing electrodes includes a first trunk portion extending in the first direction and a first branch portion extending from the first trunk portion in the second direction crossing the first direction, and the first branch portion includes a plurality of first branches and a plurality of second branches extending in a direction opposite to a direction in which the first branches extend in the second direction.

The minimum length of the straight line of each of the unit sensing electrodes corresponds to a distance in the first direction from one end of the first branches to one end of the second branches.

According to the above, the input sensor of the electronic device includes the sensing electrode provided with the trunk portion and the branch portions extending in opposite directions to each other from the trunk portion, and thus, a signal sensitivity of the adjacent sensing electrodes is improved. Accordingly, the coordinate accuracy of the input device sensed by the input sensor is enhanced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
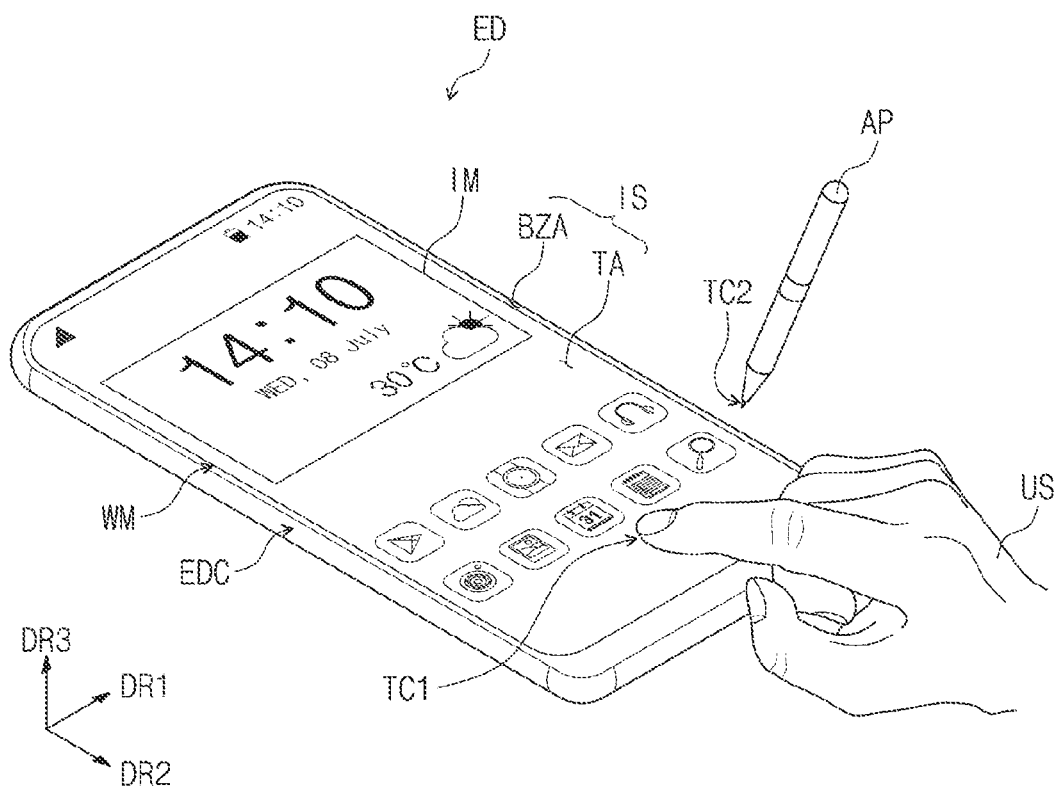
FIG. 1A is a perspective view showing an electronic device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 1B:
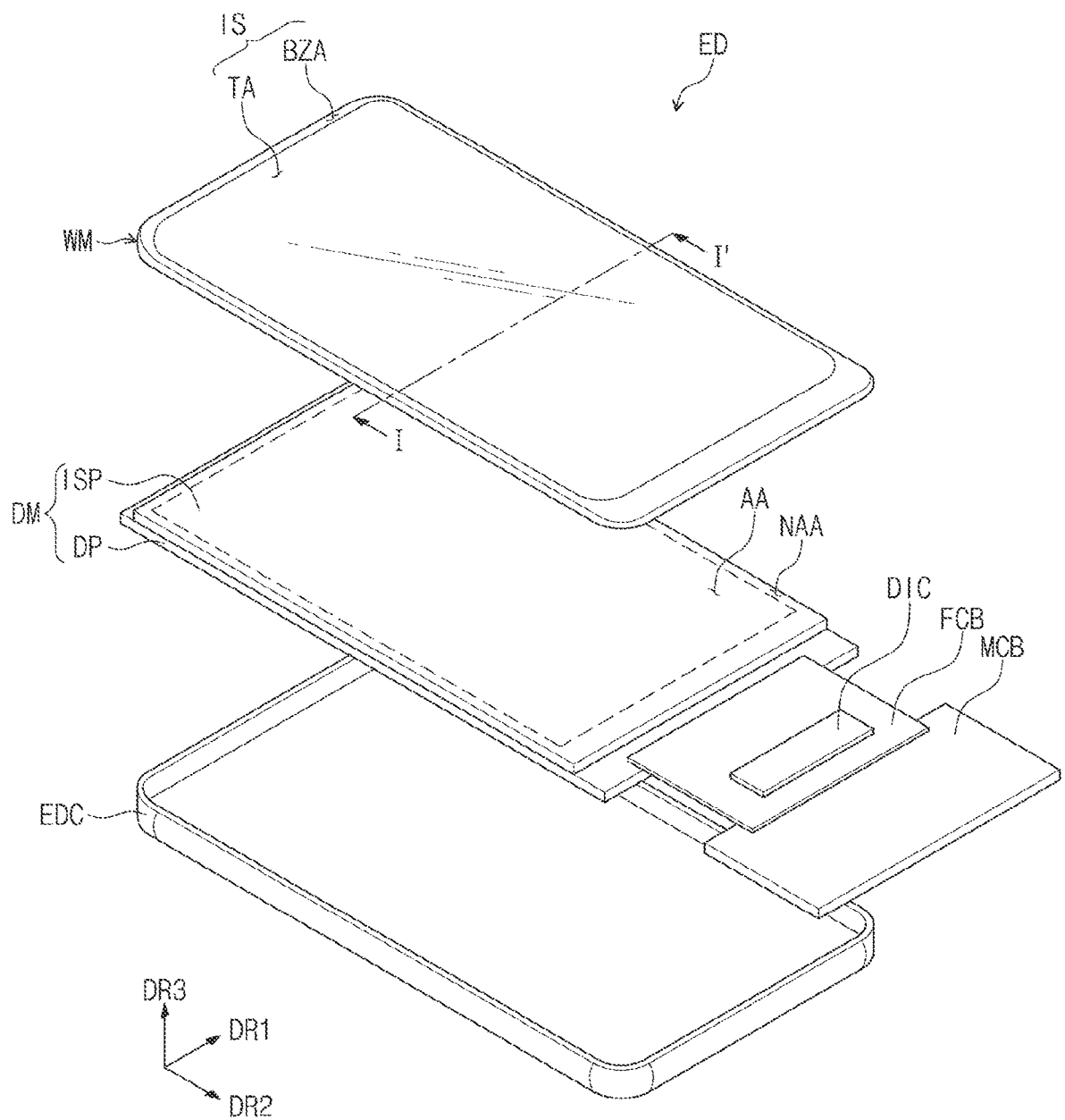
FIG. 1B is an exploded perspective view showing an electronic device according to an embodiment of the present disclosure.
Figure 2:
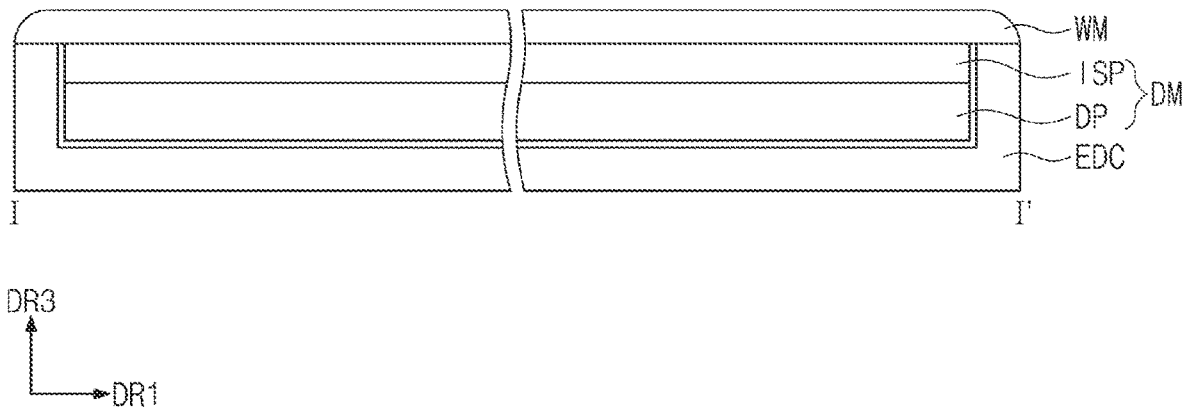
FIG. 2 is a cross-sectional view showing an electronic device according to an embodiment of the present disclosure.

FIG. 1A is a perspective view showing an electronic device ED according to an embodiment of the present disclosure. FIG. 1B is an exploded perspective view showing the electronic device ED according to an embodiment of the present disclosure. FIG. 2 is a cross-sectional view showing the electronic device according to an embodiment of the present disclosure.

Referring to FIGS. 1A and 1B, the electronic device ED may be activated in response to electrical or physical signals. The electronic device ED may be applied to various embodiments. For example, the electronic device ED may be applied to electronic devices, such as a smart watch, a tablet computer, a notebook computer, a computer, or a smart television.

The electronic device ED may display an image IM toward a third direction DR3 through a display surface IS substantially parallel to each of a first direction DR1 and a second direction DR2. The display surface IS through which the image IM is displayed may correspond to a front surface of the electronic device ED. The image IM may include a still image as well as a video.

In the present embodiment, front (or upper) and rear (or lower) surfaces of each member are defined with respect to a direction in which the image IM is displayed. The front and rear surfaces are opposite to each other in the third direction DR3, and a normal line direction of each of the front and rear surfaces is substantially parallel to the third direction DR3.

A distance in the third direction DR3 between the front surface and the rear surface may correspond to a thickness in the third direction DR3 of the electronic device ED. Meanwhile, directions indicated by the first, second, and third directions DR1, DR2, and DR3 are relative to each other, and thus, the directions indicated by the first, second, and third directions DR1, DR2, and DR3 may be changed to other directions.

The electronic device ED may sense an external input applied thereto from the outside. The external input may include inputs of various forms provided from the outside of the electronic device ED. The electronic device ED may sense a first input TC1 of a user touch US applied thereto from the outside of the electronic device ED. The first input TC1 of the user touch US may be one of various forms of external inputs, such as a part of a user's body, light, heat, or pressure, or a combination thereof. In the present embodiment, the first input TC1 of the user touch US generated by a hand of the user and applied to the front surface is shown as a representative example of the external input, however, this is merely one example, and the first input TC1 of the user touch US may be provided in various forms. In addition, the electronic device ED may sense the first input TC1 of the user touch US applied to a side surface or a rear surface of the electronic device ED according to a structure of the electronic device ED.

In addition, the electronic device ED may sense a second input TC2 applied thereto from the outside. The second input TC2 may include inputs generated by an input device AP, such as, a stylus pen, an active pen, a touch pen, an electronic pen, an e-pen, or the like, other than the hand of user for the user touch US.

The electronic device ED may include a transmission area TA and a bezel area BZA which may surround the transmission area TA. More particularly, the front surface of the electronic device ED may be divided into the transmission area TA and the bezel area BZA. The image IM may be displayed through the transmission area TA. The user may view the image IM through the transmission area TA. In the present embodiment, the transmission area TA may have a quadrangular shape with rounded vertices. However, this is merely one example, and the transmission area TA may have a variety of shapes and should not be particularly limited.

The bezel area BZA may be defined adjacent to the transmission area TA. The bezel area BZA may have a predetermined color. The bezel area BZA may surround the transmission area TA. Accordingly, the shape of the transmission area TA may be defined by the bezel area BZA, however, this is merely one example. That is, the bezel area BZA may be disposed adjacent to only one side of the transmission area TA or may be omitted. The electronic device ED may be implemented in various embodiments, and it should not be particularly limited.

As shown in FIG. 1B, the electronic device ED may include a display module DM and a window WM disposed on the display module DM. The display module DM may include a display panel DP and an input sensor ISP.

According to an embodiment, the display panel DP may be a light-emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

FIGS. 1A and 1B show the electronic device ED having a flat structure, however, the present disclosure should not be limited thereto or thereby. The electronic device ED may be curved or folded with respect to a folding axis and may have a slidable structure.

Referring to FIG. 2, the input sensor ISP may be disposed on the display panel DP. The input sensor ISP may be disposed directly on the display panel DP. According to an embodiment, the input sensor ISP may be formed on the display panel DP through successive processes. That is, when the input sensor ISP is disposed directly on the display panel DP, an adhesive film may not be disposed between the input sensor ISP and the display panel DP. According to an embodiment, an inner adhesive film may be disposed between the input sensor ISP and the display panel DP. In this case, the input sensor ISP may not be manufactured through the successive processes with the display panel DP, and the input sensor ISP may be fixed to an upper surface of the display panel DP by the inner adhesive film after being manufactured through a separate process.

The display panel DP may generate the image IM, and the input sensor ISP may obtain coordinate information on the external input, e.g., the first or second input TC1 or TC2.

The window WM may include a transparent material through which the image IM transmits. For example, the window WM may include glass, sapphire, or plastic. The window WM is shown in a single layer, however, it should not be limited thereto or thereby. The window WM may include plural layers.

Although not shown in figures, an anti-reflective layer may be further disposed between the window WM and the display module DM. The anti-reflective layer may reduce a reflectance of an external light incident thereto from the above of the window WM. According to an embodiment, the anti-reflective layer may include a retarder and a polarizer. The retarder may be a film type or liquid crystal coating type and may include a $\lambda/2$ retarder and/or a $\lambda/4$ retarder. The polarizer may also be a film type or liquid crystal coating type. The film type polarizer and the film type retarder may include a stretching type synthetic resin film, and the liquid crystal coating type polarizer and the liquid crystal coating type retarder may include liquid crystals aligned in a predetermined alignment. The retarder and the polarizer may be implemented as one polarizing film.

The display module DM may display the image in response to electrical signals and may transmit/receive information on the external input. The display module DM may include an active area AA and a peripheral area NAA, which are defined therein. The active area AA may be defined as an area that emits the image provided from the display module DM.

The peripheral area NAA may be defined adjacent to the active area AA. For example, the peripheral area NAA may surround the active area AA. However, this is merely one example, and the peripheral area NAA may be defined in various shapes and should not be particularly limited. According to an embodiment, the active area AA of the display module DM may correspond to at least a portion of the transmission area TA.

The electronic device ED may further include a main circuit board MCB, a flexible circuit film FCB, and a driving chip DIC. The main circuit board MCB may be connected to the flexible circuit film FCB and may be electrically connected to the display panel DP. The main circuit board MCB may include a plurality of driving elements. The driving elements may include a circuit unit to drive the display panel DP. The flexible circuit film FCB may be connected to the display panel DP to electrically connect the display panel DP to the main circuit board MCB. The driving chip DIC may be mounted on the flexible circuit film FCB.

The driving chip DIC may include driving elements, for example, a data driving circuit, to drive a pixel of the display panel DP. According to an embodiment, one flexible circuit film FCB is shown, however, the number of the flexible circuit films should not be limited to one. The flexible circuit film FCB may be provided in plural and may be connected to the display panel DP. FIG. 1B shows a structure in which the driving chip DIC is mounted on the flexible circuit film FCB, however, the present disclosure should not be limited thereto or thereby. For example, the driving chip DIC may be mounted directly on the display panel DP. In this case, a portion of the display panel DP, on which the driving chip DIC is mounted, may be bent to be disposed on a rear surface of the display module DM. According to an embodiment, the driving chip DIC may include a sensor controller TIC (refer to FIG. 3).

The input sensor ISP may be electrically connected to the main circuit board MCB via the flexible circuit film FCB, however, the embodiment of the present disclosure should not be limited thereto or thereby. That is, the display module DM may further include a separate flexible circuit film to electrically connect the input sensor ISP to the main circuit board MCB.

Referring back to FIG. 1B, the electronic device ED may further include an external case EDC that accommodates the display module DM. The external case EDC may be coupled to the window WM to define an exterior of the electronic device ED. That is, as shown in FIG. 2, the external case EDC coupled with the window WM may include the display module DM. The external case EDC may absorb impacts applied thereto from the outside and may prevent foreign substance and moisture from entering the display module DM, thereby protecting components accommodated in the external case EDC. Meanwhile, as an example, the external case EDC may be provided in a form in which a plurality of accommodation members is combined.

According to an embodiment, the electronic device ED may further include an electronic module that includes various functional modules to operate the display module DM, a power supply module that supplies a power required for overall operation of the electronic device ED, and a bracket coupled to the display module DM and/or the external case EDC to divide an inner space of the electronic device ED.

Figure 3:
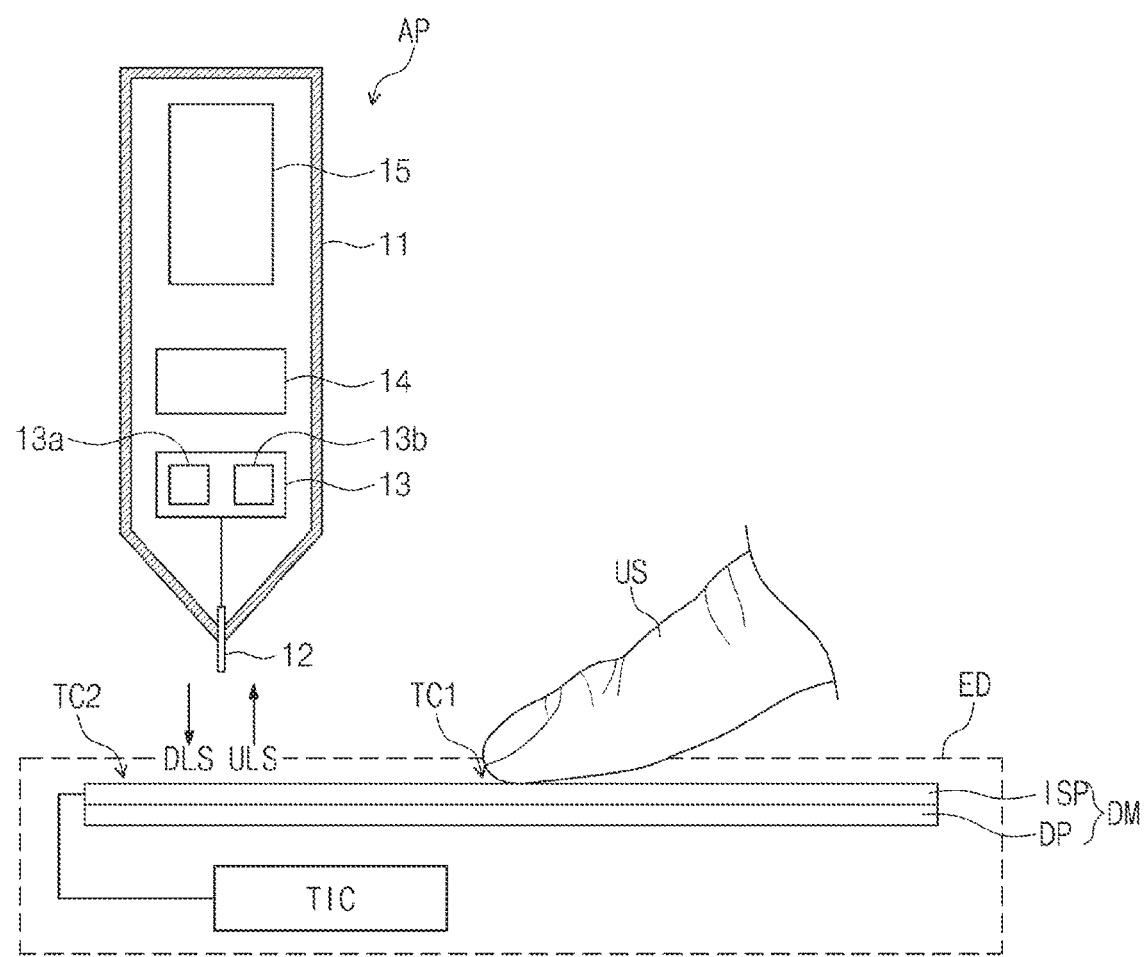
FIG. 3 is a block diagram explaining an operation of an electronic device according to an embodiment of the present disclosure.

FIG. 3 is a block diagram explaining an operation of the electronic device according to an embodiment of the present disclosure.

Referring to FIG. 3, the electronic device ED may further include the sensor controller TIC connected to the input sensor ISP. The sensor controller TIC may control a drive of the input sensor ISP. As an example, the sensor controller TIC may be mounted on the main circuit board MCB (refer to FIG. 1B), however, the present disclosure should not be limited thereto or thereby. That is, the sensor controller TIC may be built in the driving chip DIC (refer to FIG. 1B). According to an embodiment, the sensor controller TIC may be disposed on the input sensor ISP.

The input sensor ISP may include a plurality of sensing electrodes. A structure of the input sensor ISP will be described in detail later with reference to FIGS. 5A, 5B, 6, 7A, 7B, 8A, 8B, 9A, and 9B.

The sensor controller TIC may be connected to the sensing electrodes of the input sensor ISP. The sensor controller TIC may drive the input sensor ISP to sense the first input TC1 or the second input TC2.

As shown in FIG. 3, the input device AP may include a housing 11, a conductive tip 12, and a communication module 13. The housing 11 may have a pen shape and may be provided with an accommodating space defined therein. The conductive tip 12 may protrude outward through an opened end of the housing 11. The conductive tip 12 of the input device AP may make a direct contact with the input sensor ISP.

The communication module 13 may include a transmitting circuit 13a and a receiving circuit 13b. The transmitting circuit 13a may transmit a downlink signal DLS to the sensor controller TIC. The downlink signal DLS may include pen data, location information of the input device AP, a slope of the input device AP, state information of the input device AP, and the like. When the input device AP is in contact with the input sensor ISP, the sensor controller TIC may receive the downlink signal DLS via the input sensor ISP.

The receiving circuit 13b may receive an uplink signal ULS from the sensor controller TIC. The uplink signal ULS may include information, such as a beacon signal, panel information, a protocol version, and the like. The sensor controller TIC may apply the uplink signal ULS to a plurality of electrodes to sense an approach of the input device AP. When the input device AP approaches to the electronic device ED, the input device AP may receive the uplink signal ULS via the plural electrodes. As an example, the input device AP may receive the uplink signal ULS via a pen electrode.

The input device AP may further include an input controller 14 to control a drive of the input device AP. The input controller 14 may be configured to operate according to a specified program. The communication module 13 may communicate with the input controller 14a. That is, the, transmitting circuit 13a may receive a signal from the input controller 14 and may modulate the signal to a signal that is able to be sensed by the input sensor ISP, and the receiving circuit 13b may modulate a signal applied thereto via the sensing electrodes of the input sensor ISP to a signal that is able to be processed by the input controller 14.

The input device AP may further include a power module 15 to supply a power to the input device AP.

Figure 4:
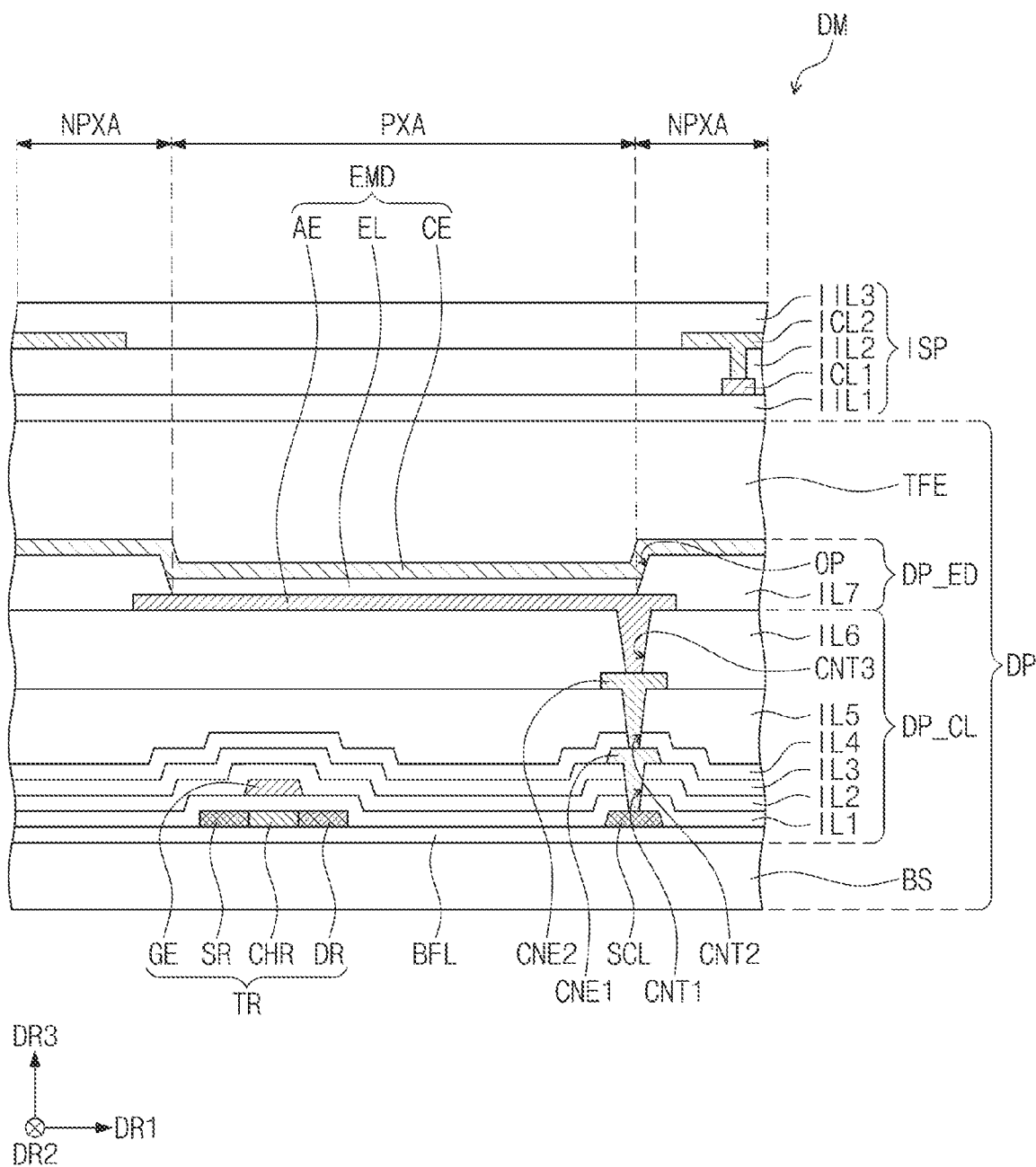
FIG. 4 is a cross-sectional view showing a display module according to an embodiment of the present disclosure.

FIG. 4 is a cross-sectional view showing the display module DM according to an embodiment of the present disclosure.

Referring to FIG. 4, the display module DM may include the display panel DP and the input sensor ISP disposed directly on the display panel DP without any interlayer therebetween. The display panel DP may include a base layer BS, a circuit layer DP_CL, a light emitting element layer DP_ED, and an encapsulation layer TFE.

The base layer BS may provide a base surface on which the circuit layer DP_CL is disposed. The base layer BS may be a glass substrate, a metal substrate, or a polymer substrate. However, the embodiment should not be limited thereto or thereby, and the base layer BS may be an inorganic layer, an organic layer, or a composite material layer.

The base layer BS may have a multi-layer structure. For instance, the base layer BS may have a three-layer structure of a synthetic resin layer, an adhesive layer, and a synthetic resin layer. The synthetic resin layer may include a polyimide-based resin. In addition, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

The circuit layer DP_CL may be disposed on the base layer BS. The circuit layer DP_CL may include an insulating layer, a semiconductor pattern, a conductive pattern, and a signal line. An insulating layer, a semiconductor layer, and a conductive layer may be formed on the base layer BS by a coating or depositing process. Then, the insulating layer, the semiconductor layer, and the conductive layer may be selectively patterned through several photolithography processes. Then, the semiconductor pattern, the conductive pattern, and the signal line included in the circuit layer DP_CL may be formed.

At least one inorganic layer may be formed on an upper surface of the base layer BS. The inorganic layer may include at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. In the present embodiment, the display panel DP may include a buffer layer BFL. That is, the buffer layer BFL may be disposed on the base layer BS.

The buffer layer BFL may increase a coupling force between the base layer BS and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon, however, it should not be limited thereto or thereby. The semiconductor pattern may include amorphous silicon or metal oxide.

FIG. 4 shows only a portion of the semiconductor pattern, and the semiconductor pattern may be further disposed in other areas. The semiconductor pattern may be arranged with a specific rule over the pixels. The semiconductor pattern may have different electrical properties depending on whether or not it is doped or whether it is doped with an N-type dopant or a P-type dopant. The semiconductor pattern may include a doped region and a non-doped region. The doped region may be doped with the N-type dopant or the P-type dopant. A PMOS transistor may include a doped region doped with the P-type dopant, and an NMOS transistor may include a doped region doped with the N-type dopant.

The doped region may have a conductivity greater than that of the non-doped region and may substantially serve as an electrode or signal line. The non-doped region may substantially correspond to an active area (or a channel area) of the transistor. In other words, a portion of the semiconductor pattern may be the active area of the transistor, and the other portions of the semiconductor pattern may be a source area or a drain area of the transistor.

Each of the pixels may have an equivalent circuit that includes seven transistors, one capacitor, and the light emitting element, and the equivalent circuit of the pixel may be changed in various ways. FIG. 4 shows one transistor TR and the light emitting element EMD included in the pixel.

A source area SR, an active area CHR, and a drain area DR of the transistor TR may be formed from the semiconductor pattern. The source area SR and the drain area DR may extend in opposite directions to each other from the active area CHR in a cross-section. FIG. 4 shows a portion of the signal line SCL disposed on the same layer as the semiconductor pattern. Although not shown in figures, the signal line SCL may be electrically connected to the transistor TR in a plane.

A first insulating layer IL1 may be disposed on the buffer layer BFL. The first insulating layer IL1 may commonly overlap the pixels and may cover the semiconductor pattern. The first insulating layer IL1 may be an inorganic layer and/or an organic layer and may have a single-layer or multi-layer structure. The first insulating layer IL1 may include at least one of aluminum oxide, titanium oxide, silicon oxide, silicon oxynitride, zirconium oxide, and hafnium oxide. In the present embodiment, the first insulating layer IL1 may have a single-layer structure of a silicon oxide layer. Not only the first insulating layer IL1, but also an insulating layer of the circuit layer DP_CL described later may be an inorganic layer and/or an organic layer and may have a single-layer or multi-layer structure. The inorganic layer may include at least one of the above-mentioned materials, however, it should not be limited thereto.

A gate GE of the transistor TR may be disposed on the first insulating layer ILE The gate GE may be a portion of a metal pattern. The gate GE may overlap the active area CHR. The gate GE may be used as a mask in a process of doping the semiconductor pattern.

A second insulating layer IL2 may be disposed on the first insulating layer IL1 and may cover the gate GE. The second insulating layer IL2 may commonly overlap the pixels. The second insulating layer IL2 may be an inorganic layer and/or an organic layer and may have a single-layer or multi-layer structure. In the present embodiment, the second insulating layer IL2 may have a single-layer structure of a silicon oxide layer.

A third insulating layer IL3 may be disposed on the second insulating layer IL2. In the present embodiment, the third insulating layer IL3 may have a single-layer structure of a silicon oxide layer.

A first connection electrode CNE1 may be disposed on the third insulating layer IL3. The first connection electrode CNE1 may be connected to the signal line SCL via a contact hole CNT1 defined through the first, second, and third insulating layers IL1, IL2, and IL3.

A fourth insulating layer IL4 may be disposed on the third insulating layer IL3. The fourth insulating layer IL4 may have a single-layer structure of a silicon oxide layer. A fifth insulating layer IL5 may be disposed on the fourth insulating layer IL4. The fifth insulating layer IL5 may be an organic layer.

A second connection electrode CNE2 may be disposed on the fifth insulating layer IL5. The second connection electrode CNE2 may be connected to the first connection electrode CNE1 via a contact hole CNT2 defined through the fourth insulating layer IL4 and the fifth insulating layer IL5.

A sixth insulating layer IL6 may be disposed on the fifth insulating layer IL5 and may cover the second connection electrode CNE2. The sixth insulating layer IL6 may be an organic layer. The light emitting element layer DP_ED may be disposed on the circuit layer DP_CL. The light emitting element layer DP_ED may include the light emitting element EMD. For example, the light emitting element layer DP_ED may include an organic light emitting material, a quantum dot, a quantum rod, a micro-LED, or a nano-LED. The light emitting element EMD may include a first electrode AE, a light emitting layer EL, and a second electrode CE.

The first electrode AE may be disposed on the sixth insulating layer IL6. The first electrode AE may be connected to the second connection electrode CNE2 via a contact hole CNT3 defined through the sixth insulating layer IL6.

A pixel definition layer IL7 may be disposed on the sixth insulating layer IL6 and may cover a portion of the first electrode AE. That is, both ends of the pixel definition layer IL7 may overlap the pixel defining layer IL7. An opening OP may be defined through the pixel definition layer IL7. At least a portion of the first electrode AE may be exposed through the opening OP of the pixel definition layer IL7. In the present embodiment, a light emitting area PXA may be defined to correspond to the portion of the first electrode AE exposed through the opening OP. A non-light-emitting area NPXA may surround the light emitting area PXA.

The light emitting layer EL may be disposed on the first electrode AE. The light emitting layer EL may be disposed in the opening OP. That is, the light emitting layer EL may be formed in each of the pixels after being divided into plural portions. When the light emitting layer EL is formed in each of the pixels after being divided into plural portions, each of the light emitting layers EL may emit a light having at least one of blue, red, and green colors, however, it should not be limited thereto or thereby. The light emitting layer EL may be commonly provided over the pixels. In this case, the light emitting layer EL may provide a blue light or a white light.

The second electrode CE may be disposed on the light emitting layer EL. The second electrode CE may have an integral shape and may be commonly disposed over the pixels. A common voltage may be applied to the second electrode CE, and the second electrode CE may be referred to as a common electrode.

Although not shown in figures, a hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the plural pixels using an open mask. The encapsulation layer TFE may be disposed on the light emitting element layer DP_ED. The encapsulation layer TFE may include an inorganic layer, an organic layer, and an inorganic layer, which are sequentially stacked, however, the layers of the encapsulation layer TFE should not be limited thereto or thereby.

The inorganic layers may protect the light emitting element layer DP_ED from moisture and oxygen, and the organic layer may protect the light emitting element layer DP_ED from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, it should not be limited thereto or thereby.

The input sensor ISP may be formed on the display panel DP through successive processes. The input sensor ISP may include a base layer HU, a first conductive layer ICL1, and a sensing insulating layer IIL2, a second conductive layer ICL2, and a cover insulating layer IIL3.

The base layer IIL1 may be an inorganic layer including one of silicon nitride, silicon oxynitride, and silicon oxide. According to an embodiment, the base layer IIL1 may include an organic layer including an epoxy-based resin, an acrylic-based resin, or an imide-based resin. The base layer IIL1 may have a single-layer structure or a multi-layer structure of layers stacked in the third direction DR3.

Each of the first conductive layer ICL1 and the second conductive layer ICL2 may have a single-layer structure or a multi-layer structure of layers stacked in the third direction DR3. The first conductive layer ICL1 and the second conductive layer ICL2 may be disposed in the non-light-emitting area NPXA. The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include a conductive polymer such as PEDOT, a metal nanowire, a graphene, or the like.

The conductive layer having the multi-layer structure may include metal layers. As an example, the metal layers may have a three-layer structure of titanium/aluminum/titanium. The conductive layer having the multi-layer structure may include at least one metal layer and at least one transparent conductive layer.

At least one of the sensing insulating layer IIL2 and the cover insulating layer IIL3 may include an inorganic layer. The inorganic layer may include at least one of aluminum oxide, titanium oxide, silicon oxide, silicon oxynitride, zirconium oxide, and hafnium oxide.

At least one of the sensing insulating layer IIL2 and the cover insulating layer IIL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Hereinafter, the structure of the sensing electrode according to an embodiment of the present disclosure will be described with reference to FIGS. 5A, 5B, 6, 7A, and 7B.

Figure 5A:
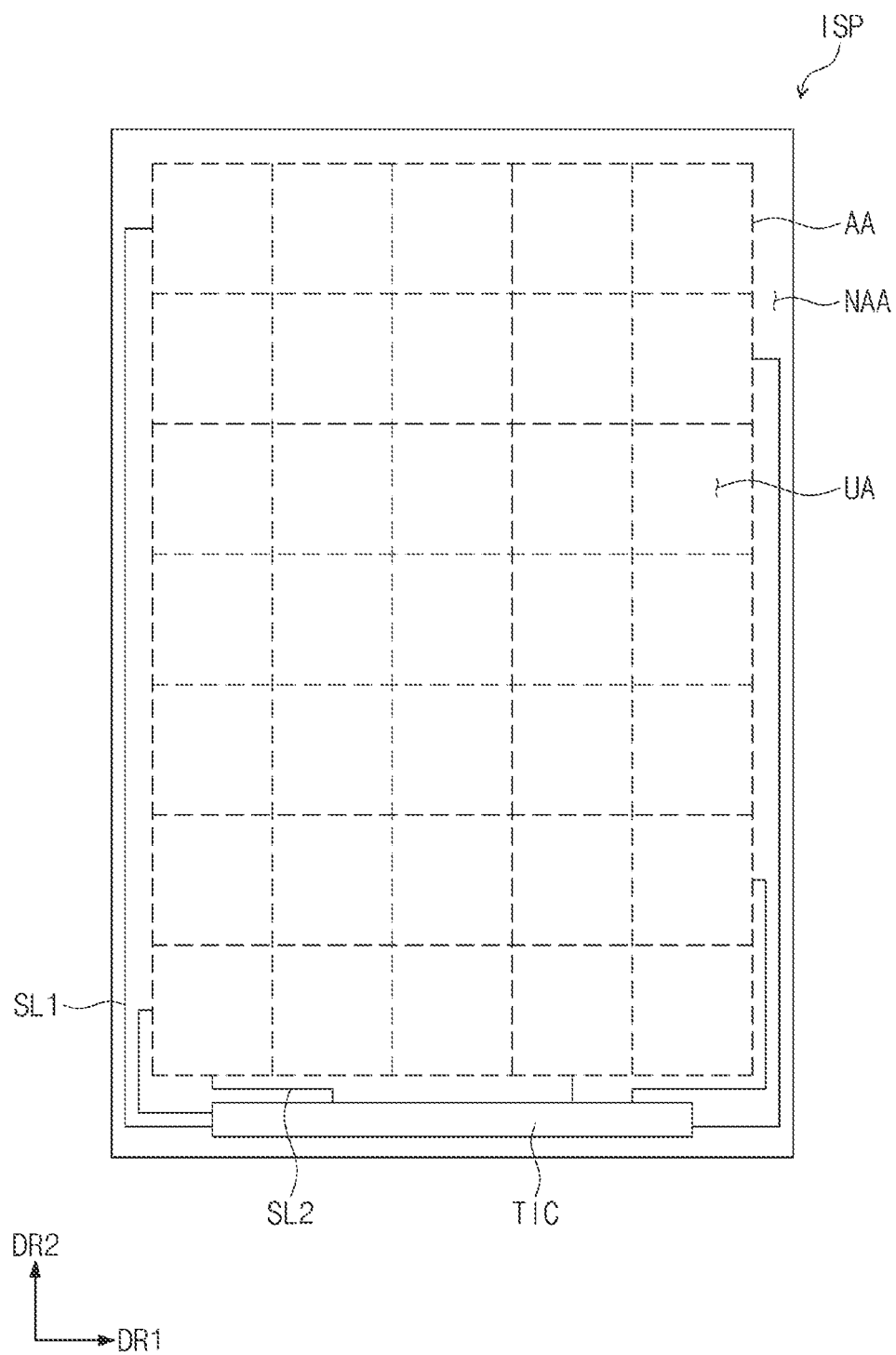
FIGS. 5A and 5B are views showing an input sensor according to an embodiment of the present disclosure.
Figure 5B:
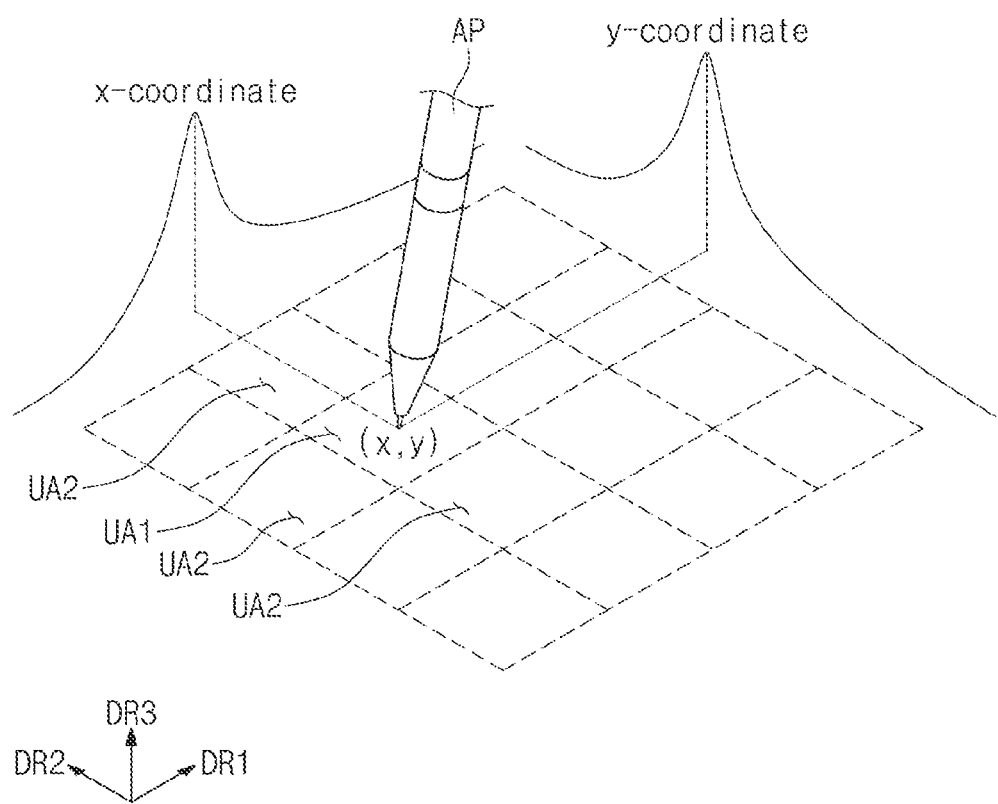
Figure 6:
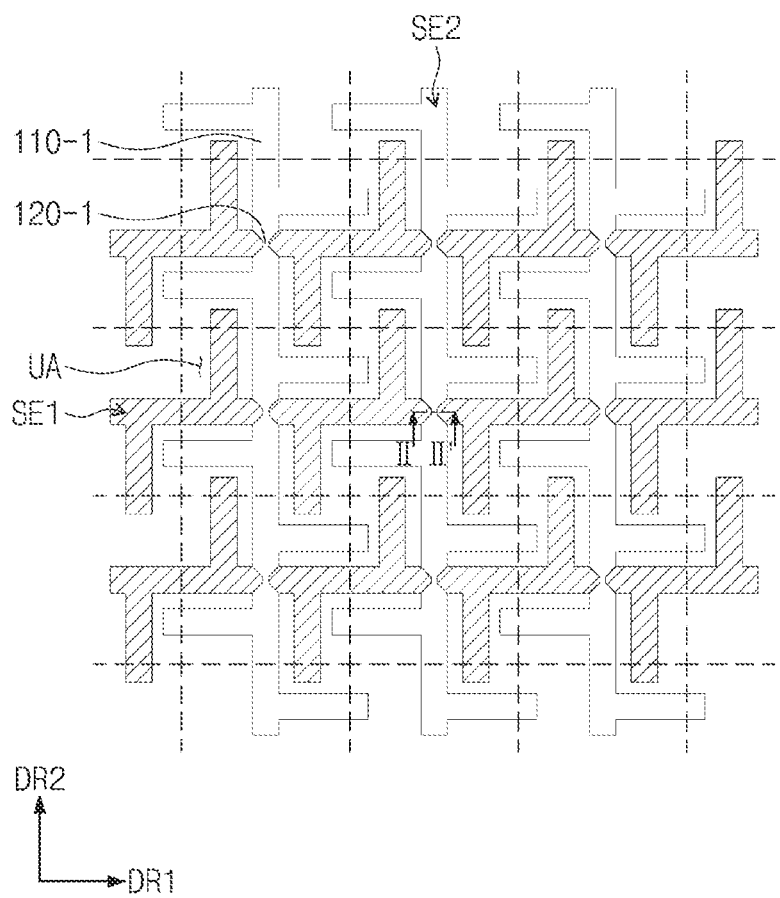
FIG. 6 is a view showing a sensing electrode according to an embodiment of the present disclosure.
Figure 7A:
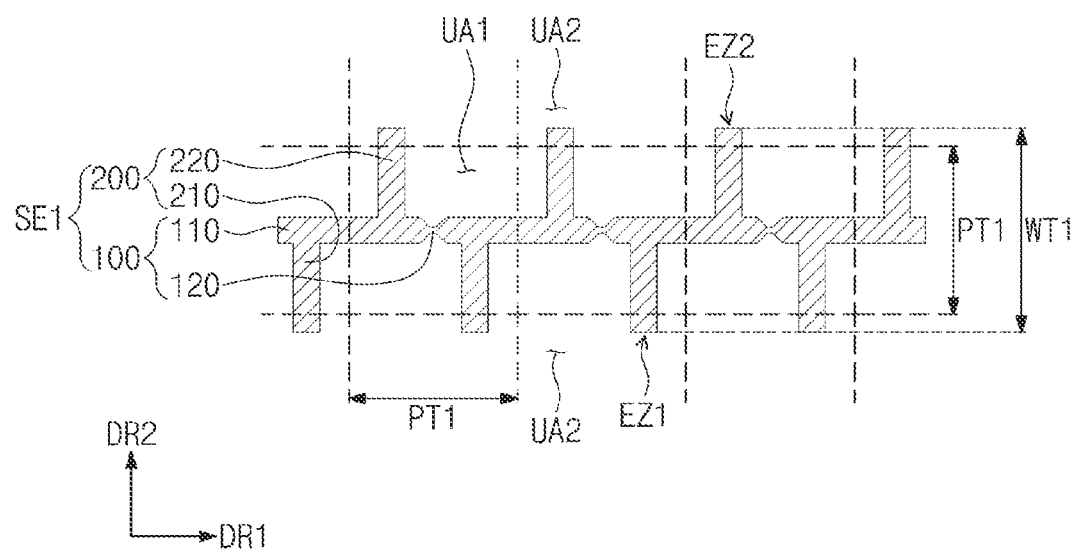
FIGS. 7A and 7B are views showing a sensing electrode according to an embodiment of the present disclosure.
Figure 7B:
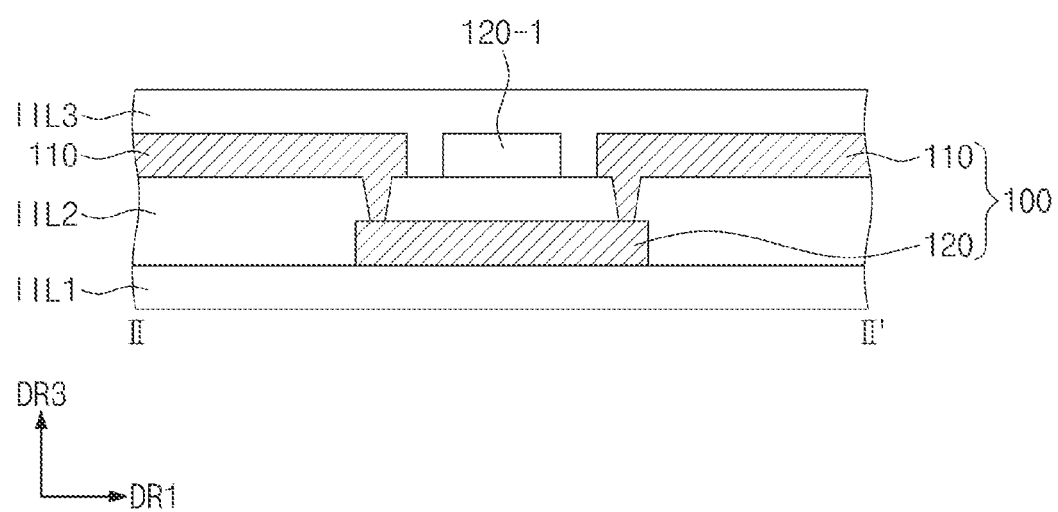

FIGS. 5A and 5B are views showing the input sensor ISP according to an embodiment of the present disclosure. FIG. 6 is a view showing the sensing electrode according to an embodiment of the present disclosure. FIGS. 7A and 7B are views showing a sensing electrode according to an embodiment of the present disclosure.

FIG. 5A shows unit areas UA of the input sensor ISP, and FIG. 5B schematically shows a sensing operation of the sensing electrodes that sense an input device in a specific unit area. FIG. 6 shows the sensing electrodes arranged in some areas of the unit areas UA of FIG. 5A. FIG. 7A shows a first sensing electrode of FIG. 6, and FIG. 7B shows a cross-section taken along a line II-II' of FIG. 6.

Referring to FIG. 5A, the input sensor ISP may include the active area AA and the peripheral area NAA. The active area AA may be an area in which the sensing electrodes are arranged. The active area AA may include the unit areas UA. The unit areas UA may have a square shape, however, they should not be limited thereto or thereby. In FIG. 5A, the unit areas UA arranged in a 5 by 7 (5 unit areas in the first direction DR1 and 7 unit areas in the second direction DR2) matrix configuration are shown, however, the arrangement of the unit areas UA should not be limited thereto or thereby. The sensing electrodes may include a plurality of unit sensing electrodes. Each of the plurality of unit sensing electrodes may be respectively disposed within the unit area UA. The unit sensing electrode may mean a sensing electrode disposed within one unit area UA. A plurality of unit sensing electrodes may be respectively disposed in the plurality of unit areas UA.

In FIG. 5A, the sensing electrodes disposed in the unit area UA are omitted for the convenience of explanation. The sensing electrodes are illustrated in FIG. 6. The input sensor ISP may include a first signal line SL1 and a second signal line SL2. The first signal line SL1 may be provided in plural, and the first signal lines SL1 may be respectively connected to a plurality of first sensing electrodes SE1. The second signal line SL2 may be provided in plural, and the second signal lines SL2 may be respectively connected to a plurality of second sensing electrodes SE2.

The first signal line SL1 and the second signal line SL2 may be connected to the sensor controller TIC. That is, the first signal line SL1 and the second signal line SL2 may transmit signals respectively sensed by the first sensing electrode SE1 and the second sensing electrode SE2 to the sensor controller TIC.

The first signal line SL1 may transmit a signal sensed by the first sensing electrode SE1 with respect to an x-coordinate in the first direction DR1 to the sensor controller TIC and may transmit a signal sensed by the second sensing electrode SE2 with respect to a y-coordinate in the second direction DR2 to the sensor controller TIC.

Referring to FIG. 5B, when a tip of the input device AP is placed at a position corresponding to a specific coordinate of the input sensor ISP and outputs a specific drive waveform, the signal may be transmitted to the sensing electrodes of the specific coordinate due to a capacitance applied to the specific coordinate of the input sensor ISP. The sensor controller TIC may compare levels of the signals applied thereto from channels of the sensing electrode and may calculate the x-coordinate and the y-coordinate of the input device AP. In the present embodiment, each channel may correspond to a group of the unit areas UA arranged in one direction. FIG. 5A shows an x-axis channel including seven unit areas UA in the first direction DR1 and a y-axis channel including five unit areas UA in the second direction DR2, however, the number of unit areas should not be limited thereto or thereby.

According to an embodiment, the x- and y-coordinates on the input sensor ISP of the input device AP may be calculated by a centroid method. The centroid method may calculate coordinates based on a physical location of the input device AP, a physical location of the specific sensing electrode on which the input device AP is located, and a capacitance between the input device and the specific sensing electrode on which the input device is located.

In addition to the signal recognized by the specific sensing electrode on which the input device AP is located, a signal recognized by an adjacent sensing electrode adjacent to the specific sensing electrode is required to occur at a certain level to calculate the exact coordinates through the centroid method. This is to sense a minute movement of the input device AP. As an example, a level of the signal recognized by the adjacent sensing electrode may be about 15% of a total signal level.

In the present embodiment, the specific unit area in which the specific sensing electrode is disposed may be referred to as a first unit area UA1, and an adjacent unit area in which the adjacent sensing electrode is disposed may be referred to as a second unit area UA2.

According to the present disclosure, the adjacent sensing electrode of the adjacent unit area may be disposed close to the specific sensing electrode of the specific unit area in which the input device is disposed. According to an embodiment, the adjacent sensing electrode disposed in the second unit area UA2 may have a shape or a pattern in which a portion of the adjacent sensing electrode extends to the first unit area UA1 where the specific sensing electrode is disposed. That is, branches extending from a trunk of the adjacent sensing electrode may extend to the first unit area UA1 beyond the second unit area UA2 to be adjacent to the specific sensing electrode. This will be described in more detail with reference to FIGS. 6 and 7A.

Referring to FIG. 6, the input sensor ISP may include the first sensing electrode SE1 and the second sensing electrode SE2. The first sensing electrode SE1 may extend in the first direction DR1, and the second sensing electrode SE2 may extend in the second direction DR2 crossing the first direction DR1. The first sensing electrode SE1 may be provided in plural, and the first sensing electrodes SE1 may be arranged in the second direction DR2. The second sensing electrode SE2 may be provided in plural, and the second sensing electrodes SE2 may be arranged in the first direction DR1.

That is, the first sensing electrode SE1 and the second sensing electrode SE2 may be disposed to intersect with each other. In the present embodiment, the first sensing electrode SE1 and the second sensing electrode SE2 are shown as having the same shape, however, they should not be limited thereto or thereby. According to an embodiment, the first sensing electrode SE1 and the second sensing electrode SE2 may have different shapes from each other.

As shown in FIG. 6, the first sensing electrode SE1 and the second sensing electrode SE2 may be disposed to cross each other in one unit area UA. One unit sensing electrode may be included in one unit area UA. One unit sensing electrode may include a portion of each of the first sensing electrode SE1 and the second sensing electrode SE2.

FIG. 7A shows one of the first sensing electrodes SE1 shown in FIG. 6. Hereinafter, the first sensing electrode SE1 will be described with reference to FIG. 7A. In the present disclosure, the second sensing electrode SE2 is described as having the same shape as that of the first sensing electrode SE1.

FIG. 7A shows a portion of the first sensing electrode SE1 disposed over the first unit area UA1 and the second unit area UA2 adjacent thereto. The second sensing electrode SE2 may have the same structure as that of the first sensing electrode SE1, and thus, hereinafter, only the first sensing electrode SE1 will be described in detail with reference to FIG. 7A.

Referring to FIG. 7A, the first sensing electrode SE1 may include a first trunk portion 100 and a first branch portion 200. The first trunk portion 100 may extend in the first direction DR1. The first trunk portion 100 may extend along a channel formed by a plurality of first unit areas UA1 arranged in the first direction DR1.

The first branch portion 200 may extend from the first trunk portion 100 in the second direction DR2. The first branch portion 200 may include a first branch 210 and a second branch 220, which respectively extend from the first trunk portion 100 in opposite directions to each other in the second direction DR2.

According to an embodiment, the first branch 210 and the second branch 220 may be substantially perpendicular to the first trunk portion 100. Each of the first branch 210 and the second branch 220 may be provided in plural.

The first trunk portion 100 may include a plurality of first sensing portions 110 and a plurality of first connection portions 120. The first sensing portions 110 may sense the input device AP (refer to FIG. 5B) approaching thereto. The first connection portions 120 may connect adjacent first sensing portions 110 to each other. That is, the first connection portion 120 is disposed between the adjacent first sensing portions 110 along the first direction DR1.

The first branch portion 200 may extend from the first sensing portion 110. According to an embodiment, the number of the first branches 210 and the number of the second branches 220, which extend from the same first sensing portion 110, may be substantially the same as each other. The first branches 210 may be disposed to be symmetrical with the second branches 220 with respect to the first trunk portion 100. The first branches 210 may be spaced apart from the second branches 220 in the first direction DR1.

As shown in FIG. 7A, at least one first connection portion 120, at least two first sensing portions 110 connected to at least one first connection portion 120, and at least one first branch 210 and/or at least one second branch 220, which respectively extend from the first sensing portions 110, may be disposed in the first unit area UA1.

Each first unit area UA1 may have a first pitch PT1. The first pitch PT1 may correspond to a straight length of the first unit area UA1 in one direction. The first unit area UA1 may have a square shape, and thus, the first pitch PT1 may correspond to a length in the first direction DR1 or the second direction DR2 of the first unit area UA1. As an example, the first pitch PT1 may be about 4 mm. The second unit area UA2 adjacent to the first unit area UA1 may have a second pitch (not shown). The second pitch may be the same as the first pitch PT1. That is, all unit areas UA may have substantially the same pitch.

In the present embodiment, a minimum length of a straight line in the second direction DR2 of the first sensing electrode SE1 may be substantially the same as a length of a straight line in the second direction DR2 between a first end EZ1 of the first branch 210 and a second end EZ2 of the second branch 220. In this case, a distance between the first end EZ1 of the first branch 210 and the second end EZ2 of the second branch 220 may be referred to as a first width WT1.

The first width WT1 may be greater than the first pitch PT1. That is, the first branch portion 200 of the first sensing electrode SE1 may be disposed in the first unit area UA1 and the second unit area UA2. The first end EZ1 and the second end EZ2 may be disposed in the second unit area UA2.

In more detail, the first branch 210 and the second branch 220 may extend to the second unit area UA2 beyond the first unit area UAl.

The length of the first branch 210 in the second direction DR2 may be substantially the same as the length of the second branch 220 in the second direction DR2. The first branch 210 and the second branch 220 may have different shapes from each other.

FIG. 7B shows a cross-section taken along a line II-II' of FIG. 6. As shown in FIG. 7B, the first sensing portion 110 and the first connection portion 120 may be disposed on different layers from each other. That is, the first sensing portion 110 may be disposed on the sensing insulating layer IIL2, and the first connection portion 120 may be disposed on the base layer IIL1. The first sensing portion 110 may be electrically connected to the first connection portion 120 through contact holes (not shown herein) defined in the sensing insulating layer IIL2. A second connection portion 120-1 of the second sensing electrode SE2 (refer to FIG. 6) may be disposed on the same layer as a second sensing portion 110-1. The first sensing portion 110 and the second sensing portion 110-1 may be disposed on the same layer. That is, the first sensing portion 110 and the second connection portion 120-1 may be disposed on the same layer.

Figure 8A:
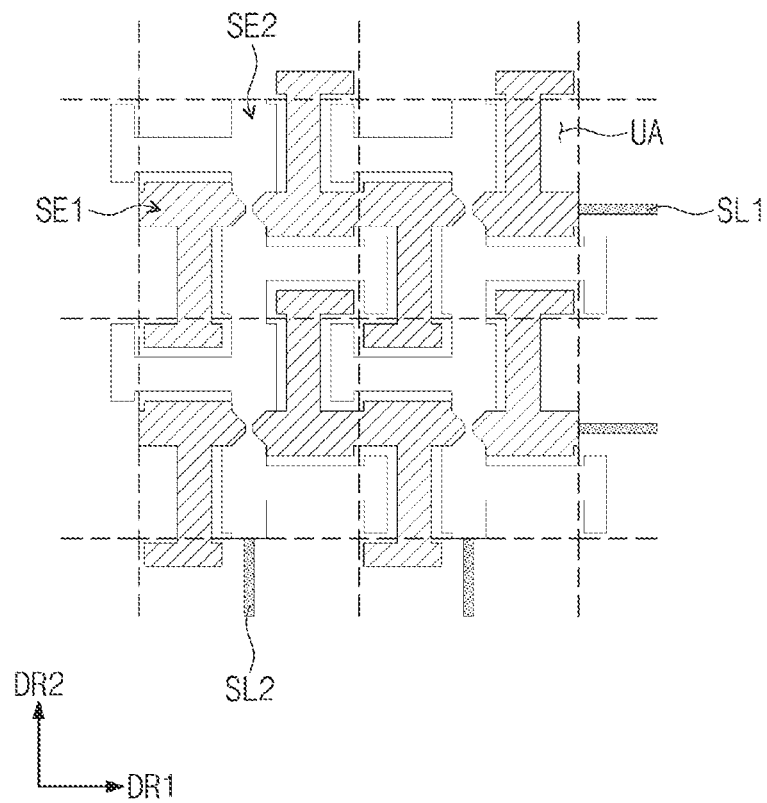
FIGS. 8A and 8B are views showing a sensing electrode according to an embodiment of the present disclosure.
Figure 8B:
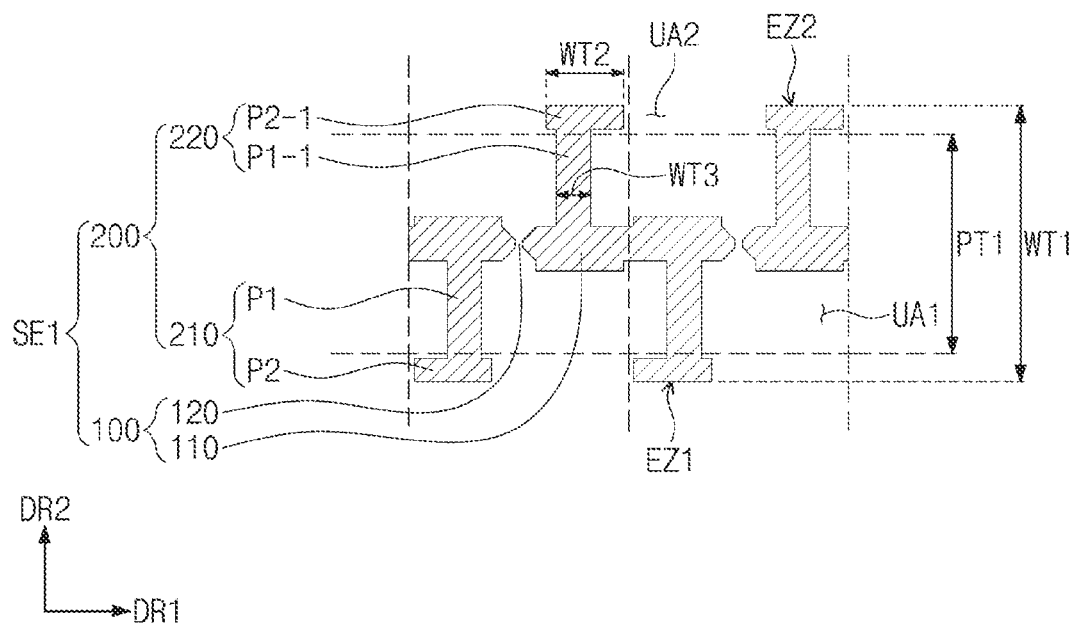

FIGS. 8A and 8B are views showing a sensing electrode according to an embodiment of the present disclosure. FIGS. 8A and 8B show a trunk portion and a branch portion, which have different shapes from those of the FIG. 7A.

Referring to FIGS. 8A and 8B, a first trunk portion 100 may extend in the first direction DR1 in a zigzag shape. That is, first sensing portions 110 of the first trunk portion 100 may have a point symmetric shape with respect to a first connection portion 120. In addition, the first sensing portions 110 may have a staggered pattern with respect to a boundary between first unit areas UA1 adjacent to each other.

Referring to FIG. 8A, a first sensing electrode SE1 may be connected to a first signal line SL1. A second sensing electrode SE2 may be connected to a second signal line SL2. The first signal line SL1 and the second signal line SL2 may be disposed in the peripheral area NAA (refer to FIG. 5A).

Referring to FIG. 8B, a first branch 210 may include a first portion P1 and a second portion P2. A second branch 220 may include a first portion P1-1 and a second portion P2-1.

The first portions P1 and P1-1 may be disposed adjacent to the first trunk portion 100, and the second portions P2 and P2-1 may not be adjacent to the first trunk portion 100 and may be adjacent to the first portions P1 and P1-1. The first portions P1 and P1-1 may extend directly from the first connection portion 120, and the second portions P2 and P2-1 may extend from the first portions P1 and P1-1. That is, each of the second portions P2 and P2-1 may be attached to each of the first portions P1 and P1-1.

At least some portions of the first portions P1 and P1-1 may be disposed in a first unit area UA1, and the entireties of the second portions P2 and P2-1 may be disposed in a second unit area UA2.

The second portions P2 and P2-1 may have a width WT2 greater than a width WT3 of the first portions P1 and P1-1. Each of the first portions P1 and P1-1 may have a shape different from each of the second portions P2 and P2-1. That is, each of the first portions P1 and P1-1 has a rectangular shape having a longer length in the second direction DR2, whereas each of the second portions P2 and P2-1 has a rectangular shape having a longer length in the first direction DR1.

In FIGS. 8A and 8B, the second portions P2 and P2-1 are shown as a rectangular shape, however, they should not be limited thereto or thereby. According to an embodiment, the shape of the second portions P2 and P2-1 may be implemented in various ways as long as the second portions P2 and P2-1 do not intrude the first sensing electrode adjacent thereto in the second unit area UA2. As an example, the second portions P2 and P2-1 may have various shapes, such as a circular shape, a triangular shape, or a Y-shape. According to an embodiment, the shape of the second portion P2 of the first branch 210 may be different from the shape of the second portion P2-1 of the second branch 220.

A first width WT1 in the second direction DR2 of the first sensing electrode SE1 may be greater than a first pitch PT1 of the first unit area UAL As an example, the first width WT1 may be greater than the first pitch PT1 by a length obtained by summing a length in the second direction DR2 of the second portion P2 of the first branch and a length in the second direction DR2 of the second portion P2-1 of the second branch.

Figure 9A:
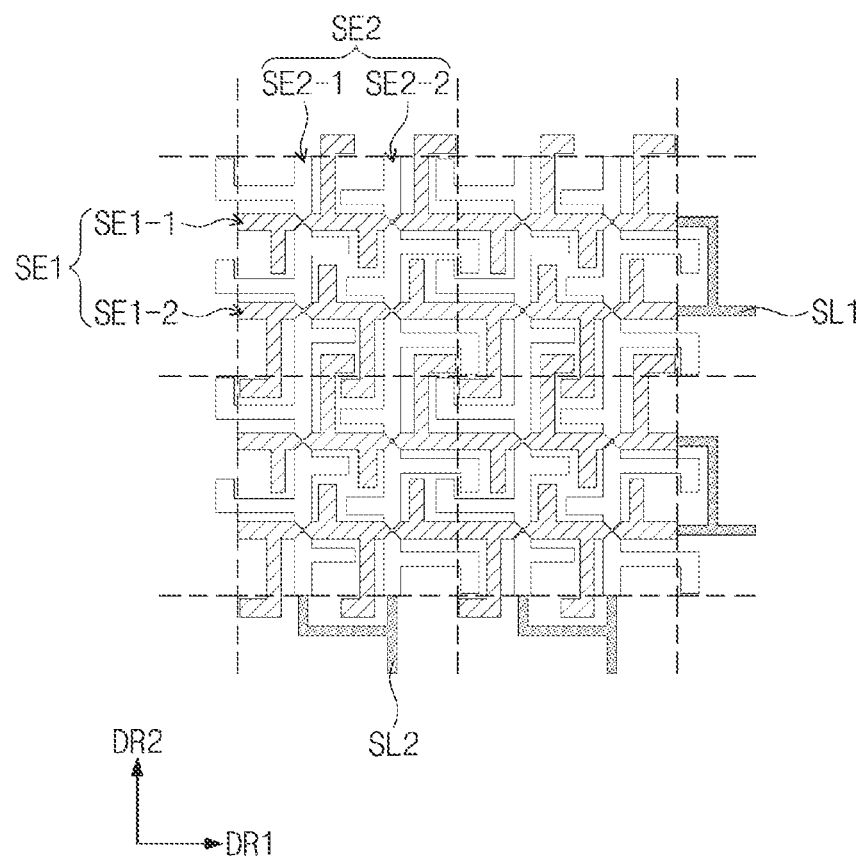
FIGS. 9A and 9B are views showing a sensing electrode according to an embodiment of the present disclosure.
Figure 9B:
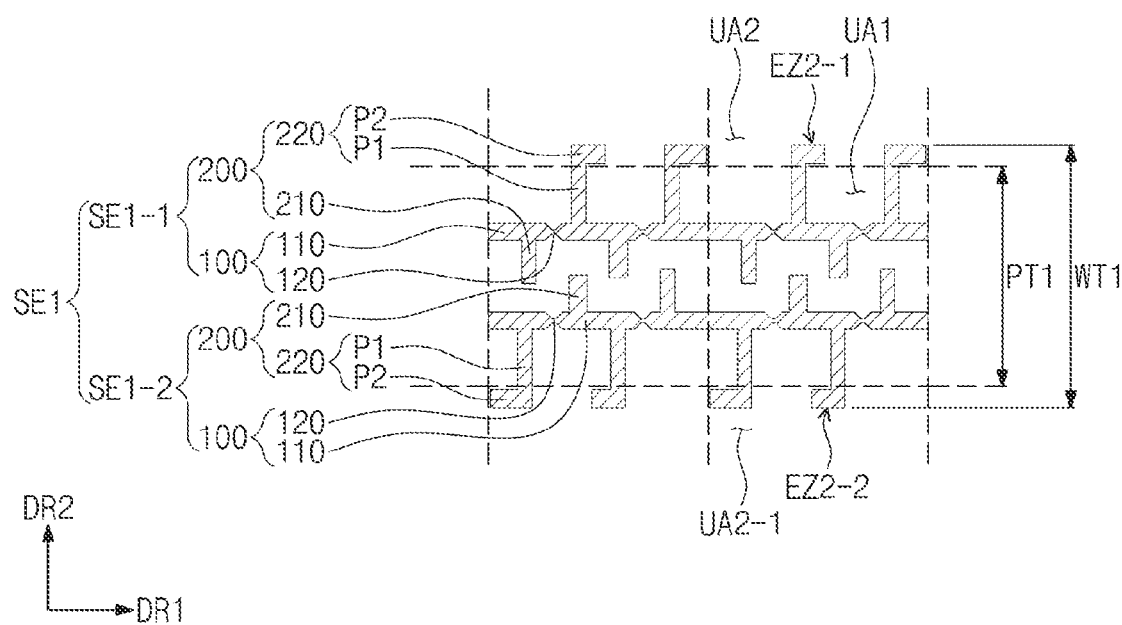

FIGS. 9A and 9B are views showing a sensing electrode according to an embodiment of the present disclosure.

Referring to FIGS. 9A and 9B, each of a first sensing electrode SE1 and a second sensing electrode SE2 may include a plurality of trunk portions and a plurality of branch portions.

One first sensing electrode SE1 may include a plurality of first sub-sensing electrodes SE1-1 and SE1-2, and one second sensing electrode SE2 may include a plurality of second sub-sensing electrodes SE2-1 and SE2-2. Two first sub-sensing electrodes SE1-1 and SE1-2 and two second sub-sensing electrodes SE2-1 and SE2-2 are shown, however, the number of the first sub-sensing electrodes SE1-1 and SE1-2 and the number of the second sub-sensing electrodes SE2-1 and SE2-2 should not be limited thereto or thereby.

Each of the first sub-sensing electrodes SE1-1 and SE1-2 may include a first trunk portion 100 and a first branch portion 200. Each of the second sub-sensing electrodes SE2-1 and SE2-2 may include a second trunk portion and a second branch portion. The second sub-sensing electrodes SE2-1 and SE2-2 may have substantially the same structure and shape as those of the first sub-sensing electrodes SE1-1 and SE1-2 and may be substantially perpendicular to the first sub-sensing electrodes SE1-1 and SE1-2.

As depicted in FIG. 9A, the first sub-sensing electrodes SE1-1 and SE1-2 may be electrically connected to each other. That is, the first trunk portion 100 of the first sub-sensing electrode SE1-1 and the first trunk portion 100 of the first sub-sensing electrode SE1-2 may be electrically connected to each other. The first sub-sensing electrodes SE1-1 and SE1-2 may be connected to the first signal line SL1.

FIG. 9B shows a portion of the first sensing electrode SE1 disposed in a first unit area UAl. The first sensing electrode SE1 may include two first sub-sensing electrodes SE1-1 and SE1-2 arranged parallel to each other along the first direction DR1. The two first sub-sensing electrodes SE1-1 and SE1-2 may be disposed to be symmetrical with each other. The first sub-sensing electrodes SE1-1 and SE1-2 may include first branches 210 and second branches 220, which extend in opposite directions to each other in the second direction DR2.

The first branches 210 and the second branches 220 may have different shapes from each other. As an example, a length in the second direction DR2 of the first branches 210 may be different from a length in the second direction DR2 of the second branches 220. That is, the length of each of the first branches 210 may be shorter than the length of each of the first branches 220. The first branches 210 of the first sub-sensing electrodes SE1-1 may face the first branches 210 of the first sub-sensing electrodes SE1-2 different from the first sub-sensing electrodes SE1-1. The second branches 220 of the first sub-sensing electrodes SE1-1 may extend in a direction opposite to a direction in which the second branches 220 of the first sub-sensing electrodes SE1-2 different from the first sub-sensing electrodes SE1-1. The second branches 220 of the first sub-sensing electrodes SE1-1 and the second branches 220 of the first sub-sensing electrodes SE1-2 different from the first sub-sensing electrodes SE1-1 may extend to second unit areas UA2 and UA2-1 different from each other and spaced apart from each other with the first unit area UA1 interposed therebetween.

Each of the second branches 220 may include a first portion P1 and a second portion P2. The second portion P2 may be disposed in the second unit area UA2. That is, the second portions P2 of the first sub-sensing electrodes SE1-1 and SE1-2 may be respectively disposed in the second unit areas UA2 and UA2-1 different from each other and spaced apart from each other with the first unit area UA1 interposed therebetween.

The second portions P2 of the first sub-sensing electrodes SE1-1 and SE1-2 different from each other may include edges EZ2-1 and EZ2-2, respectively. A straight length in the second direction DR2 between the two edges EZ2-1 and EZ2-2 may be referred to as a first width WT1. The first width WT1 may be greater than a first pitch PT1 of the first unit area UA1.

According to an embodiment, the input sensor ISP of the electronic device may include the first sensing electrode SE1 including the first branch portion 200 disposed in the first unit area UA1 and expanded to the adjacent second unit area UA2. The input sensor ISP may include the second sensing electrode SE2 extending in the direction crossing the first sensing electrode SE1. Although not shown separately, the structure or pattern of the second sensing electrode SE2 may be the same as the structure or pattern of the first sensing electrode SE1. That is, the second sensing electrode SE2 may include a second branch portion extending from the second trunk portion in a direction perpendicular to the second trunk portion, and the second branch portion may be expanded to the adjacent second unit area.

According to an embodiment, when the signal from the input device is sensed by the specific sensing electrode disposed in the unit area, the signal, which is required to precisely measure the coordinate, sensed by the adjacent sensing electrode disposed in adjacent unit area may be efficiently recognized.

That is, according to an embodiment, the level of the adjacent signal recognized by the adjacent sensing electrode may be sufficiently secured as the signal of the branch portion of the adjacent sensing electrode, which extends from the adjacent sensing electrode of the adjacent unit area to the unit area where the specific sensing electrode is placed, is recognized as the adjacent signal.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present disclosure shall be determined according to the attached claims.

What is claimed is:

1. An electronic device comprising:
   a display panel; and
   an input sensor disposed on the display panel and having a first sensing electrode extending in a first direction, the first sensing electrode including:
     a first trunk portion extending in the first direction; and
     a first branch portion extending from the first trunk portion in a second direction crossing the first direction,
   wherein the first branch portion includes a plurality of first branches and a plurality of second branches,
   wherein each of the first branches extends downward from one end of the first trunk portion in the second direction, and each of the second branches extends upward from an other end of the first trunk portion in the second direction, and a number of the first branches is equal to a number of the second branches,
   wherein the input sensor includes an active area in which the first sensing electrode is disposed, the active area of the input sensor includes a plurality of unit areas each having a first pitch, and at least one of the first branches and at least one of the second branches cross over each of the unit areas, wherein the first branches and the second branches include a first portion that is adjacent to the first trunk portion and a second portion that is not adjacent to the first trunk portion, and the second portion has a width greater than a width of the first portion, wherein the input sensor includes an active area in which the first sensing electrode is disposed and a peripheral area defined adjacent to the active area, and the active area includes a first unit area and a second unit area adjacent to the first unit area, and wherein the first trunk portion and at least some portions of the first portion are disposed in the first unit area, and an entirety of the second portion is disposed in the second unit area.

2. The electronic device of claim 1, wherein the input sensor further includes a peripheral area in which signal lines connected to the first sensing electrode are disposed, and the peripheral area is defined adjacent to the active area.

3. The electronic device of claim 2, wherein the first branch portion is disposed in the active area.

4. The electronic device of claim 2, wherein at least one of the first branches and at least one of the second branches are disposed in each of the unit areas.

5. The electronic device of claim 4, wherein a straight distance from one end of the first branch to one end of the second branch in the second direction is larger than the first pitch.

6. The electronic device of claim 1, wherein the first sensing electrode is provided in plural, and the first sensing electrodes are arranged in the second direction.

7. The electronic device of claim 1, wherein the first branches and the second branches are substantially perpendicular to the first trunk portion.

8. The electronic device of claim 1, wherein the input sensor further includes a second sensing electrode substantially perpendicular to the first sensing electrode and extending in the second direction, and wherein the second sensing electrode includes:
a second trunk portion extending in the second direction; and
a second branch portion extending from the second trunk portion in the first direction, the second branch portion includes a plurality of third branches and a plurality of fourth branches, the third branches extend in a direction opposite to a direction in which the fourth branches extend, and a number of the third branches is equal to a number of the fourth branches.

9. The electronic device of claim 8, wherein the first trunk portion includes:
a plurality of first sensing portions; and
a plurality of first connection portions disposed between the first sensing portions and connecting adjacent first sensing portions, the first sensing portions are disposed on a layer different from a layer on which the first connection portions are disposed, and
wherein the second trunk portion includes:
a plurality of second sensing portions; and
a plurality of second connection portions disposed between the second sensing portions and connecting adjacent second sensing portions, and the second sensing portions are disposed on a same layer as the second connection portions.

10. The electronic device of claim 9, wherein the first branch portion extends from the first sensing portion in the second direction, and the second branch portion extends from the second sensing portion in the first direction.

11. The electronic device of claim 8, further comprising a sensor controller,
wherein the input sensor further includes:
a first signal line connected to the first sensing electrode; and
a second signal line connected to the second sensing electrode, and the first signal line and the second signal line are connected to the sensor controller.

12. The electronic device of claim 1, wherein each of the first trunk portion and the first branch portion is provided in plural.

13. The electronic device of claim 12, wherein a length of the first branches is different from a length of the second branches.

14. The electronic device of claim 13, wherein first branches different from each other and respectively included in the first branch portions different from each other and adjacent to each other among the first branch portions face each other, and second branches different from each other and respectively included in the first branch portions different from each other and adjacent to each other among the first branch portions extend in opposite directions to each other.

15. The electronic device of claim 12, wherein the first branch portions are electrically connected to each other.

16. The electronic device of claim 1, wherein the second portion of the first branches has a shape different from a shape of the second portion of the second branches.

17. An electronic device comprising:
a display panel; and
an input sensor disposed on the display panel, including an active area defined therein and comprising a plurality of unit areas each having a first pitch, and including a plurality of unit sensing electrodes respectively disposed in the unit areas,
wherein a length in a first direction of each of the unit areas is smaller than a minimum length of a straight line of each of the unit sensing electrodes in a second direction,
wherein each of the unit sensing electrodes includes a first trunk portion extending in the first direction and a first branch portion extending from the first trunk portion in the second direction crossing the first direction, and the first branch portion includes a plurality of first branches and a plurality of second branches extending in a direction opposite to a direction in which the first branches extend in the second direction, wherein at least one of the first branches and at least one of the second branches cross over each of the unit areas,
wherein the first branches and the second branches include a first portion that is adjacent to the first trunk portion and a second portion that is not adjacent to the first trunk portion, and the second portion has a width greater than a width of the first portion,
wherein the input sensor includes an active area in which a first sensing electrode is disposed and a peripheral area defined adjacent to the active area, and the active area includes a first unit area and a second unit area adjacent to the first unit area, and
wherein the first trunk portion and at least some portions of the first portion are disposed in the first unit area, and an entirety of the second portion is disposed in the second unit area.

18. The electronic device of claim 17, wherein the minimum length of the straight line of each of the unit sensing electrodes corresponds to a distance in the second direction from one end of the first branches to one end of the second branches.

* * * * *